(12) United States Patent
Hölke et al.

(10) Patent No.: US 9,653,620 B2
(45) Date of Patent: May 16, 2017

(54) SEMICONDUCTOR DEVICE

(71) Applicants: Alexander Dietrich Hölke, Sarawak (MY); Deb Kumar Pal, Kolkata (IN); Kia Yaw Kee, Sarawak (MY); Yang Hao, Sarawak (MY)

(72) Inventors: Alexander Dietrich Hölke, Sarawak (MY); Deb Kumar Pal, Kolkata (IN); Kia Yaw Kee, Sarawak (MY); Yang Hao, Sarawak (MY)

(73) Assignee: X-FAB SEMICONDUCTOR FOUNDRIES AG, Efurt (DE)

( * ) Notice: Subject to any disclaimer, the term of this patent is extended or adjusted under 35 U.S.C. 154(b) by 0 days.

(21) Appl. No.: 14/932,538

(22) Filed: Nov. 4, 2015

(65) Prior Publication Data

US 2016/0056305 A1    Feb. 25, 2016

Related U.S. Application Data

(63) Continuation of application No. 13/321,960, filed as application No. PCT/EP2010/056675 on May 14, 2010, now Pat. No. 9,202,937.

(30) Foreign Application Priority Data

May 22, 2009    (WO) .................. PCT/IB2009/052160

(51) Int. Cl.
*H01L 29/868* (2006.01)
*H01L 29/40* (2006.01)
*H01L 29/861* (2006.01)

(52) U.S. Cl.
CPC .......... *H01L 29/868* (2013.01); *H01L 29/405* (2013.01); *H01L 29/407* (2013.01); *H01L 29/8611* (2013.01)

(58) Field of Classification Search
None
See application file for complete search history.

(56) References Cited

U.S. PATENT DOCUMENTS 7,411,249 B1    8/2008  Blanchard
7,531,875 B2    5/2009  Udrea et al.
(Continued)

FOREIGN PATENT DOCUMENTS

WO        02/063694        8/2002

OTHER PUBLICATIONS

PCT, International Search Report, International Application No. PCT/EP2010/056675 (Sep. 22, 2010).
(Continued)

*Primary Examiner* — Angel Roman
*Assistant Examiner* — Kevin Quinto
(74) *Attorney, Agent, or Firm* — Thompson Hine LLP

(57) ABSTRACT

A semiconductor device including a p or p+ doped portion and an n or n+ doped portion separated from the p or p+ doped portion by a semiconductor drift portion. The device further includes an insulating portion provided adjacent the drift portion and at least one of the doped portions in a region where the drift portion and the at least one doped portion meet. The device further includes at least one additional portion, wherein the at least one additional portion is located such that, when the doped portions and the at least one additional portion are biased, the electrical potential lines leave the semiconductor drift portion homogeneously.

5 Claims, 12 Drawing Sheets

(56) References Cited

U.S. PATENT DOCUMENTS

| | | |
|---|---|---|
| 2004/0227188 A1 | 11/2004 | Terashima et al. |
| 2005/0073030 A1 | 4/2005 | Inoue et al. |
| 2008/0197441 A1* | 8/2008 | Mauder ............... H01L 29/0653 257/487 |
| 2009/0090992 A1 | 4/2009 | Lerner et al. |

OTHER PUBLICATIONS

PCT, International Search Report, International Application No. PCT/IB2009/052160 (Oct. 23, 2009).
US, Non-Final Office Action, U.S. Appl. No. 13/321,960 (Dec. 7, 2012).
US, Non-Final Office Action, U.S. Appl. No. 13/321,960 (Aug. 2, 2013).
US, Final Office Action, U.S. Appl. No. 13/321,960 (May 8, 2014).
US, Advisory Action, U.S. Appl. No. 13/321,960 (Sep. 25, 2014).
US, Non-Final Office Action, U.S. Appl. No. 13/321,960 (Dec. 26, 2014).
US, Notice of Allowance, U.S. Appl. No. 13/321,960 (Aug. 3, 2015).

* cited by examiner

SEMICONDUCTOR DEVICE

This application is a continuation of U.S. patent application Ser. No. 13/321,960, filed on Feb. 6, 2012 and entitled SEMICONDUCTOR DEVICE, which is the United States national phase of International Application No. PCT/EP2010/056675 filed on May 14, 2010, which claims priority to International Application No. PCT/IB2009/052160 filed on May 22, 2009. The entire contents of each of these applications are hereby incorporated by reference.

This invention relates to the field of semiconductor devices, more specifically but not restricted to, high voltage semiconductor devices, such as lateral high voltage devices in thick-film SOI power integrated circuit technologies.

BACKGROUND

High voltage semiconductor devices such as diodes, transistors and insulated gate bipolar transistors usually include heavily doped semiconductor areas so as to define a p-n junction. A p-n junction is one of the basic building blocks of semiconductor technology. For high voltage devices such a junction comprises three regions: a p-doped region which has a high concentration of acceptors, acting as 'holes'; an n-doped region which has a high concentration of donors, and a drift region separating the n- and p-doped regions. The drift region is also known as a lightly-doped region or voltage-supporting region. The transport of charge carriers through the drift region indicates whether the device is switched on or off. The p-n junction depletes in the off-state (i.e. charge carriers are swept out) and the drift region insulates the p-doped region from the n-doped region, thus supporting the off-state voltage. Many high voltage devices can carry voltages of 60 V and higher.

FIG. 1 shows a high voltage junction 7 represented by a PIN junction. However, other configurations are possible such as RESURF and Super Junctions. The junction 7 shown in FIG. 1 has three regions: the p-doped region 7a, the drift region 7b and the n-doped region 7c. The drift region separates the p- and n-doped portions. FIG. 1 shows a theoretical illustration, since in this example the junction is suspended in air or vacuum 4.

FIG. 2 shows the junction 7 of FIG. 1, wherein a voltage difference V1 is applied across the p-n junction. The electrical potential lines 8 in air or vacuum are homogeneous in the drift region 7b and spread out slowly in vacuum 4. There are no regions in which the density of the electrical field lines increases significantly with respect to the drift region 7b.

However, in any practical application, in particular in ICs, the junction will not be suspended in air or vacuum, but will be surrounded by other semiconductor devices.

FIG. 3 shows the junction of FIG. 1 embedded in a dielectric region 5 and surrounded by a semiconductor region 2 instead of being suspended in vacuum or air. The semiconductor region 2 is normally held at a low voltage. The p- and n-doped regions are separated from each other by a width 7w. The p-n junction is at a distance 5w from the semiconductor region 2 in the direction indicated in the figure.

In the horizontal plane, the junction is surrounded by the dielectric region 5 as shown in FIG. 3. In vertical direction, the junction is mounted on an insulating layer (not shown). This configuration is called silicon on insulator (SOI).

FIG. 4 shows the junction and surrounding regions of FIG. 3 including the electrical potential lines. The potential lines wrap around the higher potential region 7c causing an electric field peak at the critical n+/drift/dielectric interfaces, indicated by 'A' in FIG. 4. The electric field peak causes charge carriers inside the doped portion to accelerate towards the interface. If the acceleration of the carriers is large, they will leave the p-n junction and enter the dielectric material from which they will not be able to return. This effect is called carrier injection into the dielectric material and is undesirable, since it will alter the device's electrical characteristics and parameters such as breakdown voltage and on-resistance. Depending on the electric field and current level this may lead to short-term failure or long-term parameter drift, which degrades reliability.

The distance 5w between the sides of the p-n junction where the potential lines leave the drift region and the surrounding semiconductor material 2 is in one case made to be about the same as, or larger than, the width of the drift portion 7b, in order to reduce the electric field peak at the interface. However, even when the distance 5w is large compared to the dimensions of the p-n junction, there will be some bending in the potential lines and an electric field peak because the surrounding region 2 is held at a low voltage, for example 0V. A large width 5w causes the combined p-n junction and dielectric material to become larger and take up more space.

SUMMARY

It has been appreciated by the inventors that the junction not only needs to be insulated from other devices, but also needs to be terminated such that it does not disturb the electric field in the drift region. Both insulation and termination can be achieved by p-n junctions or by embedding the junction in an insulating material such as a dielectric material.

At least some embodiments of the present invention take measures to actively shape the electric field at an interface of an n-doped portion, a drift portion and a termination portion in a semiconductor device. It is an aim of at least some embodiments to move points of a high electric field away from the interface into a dielectric termination region where it will not cause any damage or at least reduce or eliminate deterioration of the device. Advantages of some embodiments are an increased breakdown voltage, better device stability, improved reliability such as hot-carrier integrity and reduction of the overall size of the device.

Accordingly, in one aspect the present invention provides a semiconductor device comprising:

a p or p+ doped portion;

an n or n+ doped portion separated from the p or p+ doped portion by a semiconductor drift portion;

an insulating portion provided adjacent the drift portion and at least one of the doped portions in a region where the drift portion and said at least one doped portion meet; and at least one additional portion which is arranged for significantly reducing the variation of the electric field strength in said region when a voltage difference is applied between the doped portions.

BRIEF DESCRIPTION OF THE DRAWINGS

Some embodiments of the invention will now be described by way of example only and with reference to the accompanying drawings, in which.

DETAILED DESCRIPTION

Figure 5:
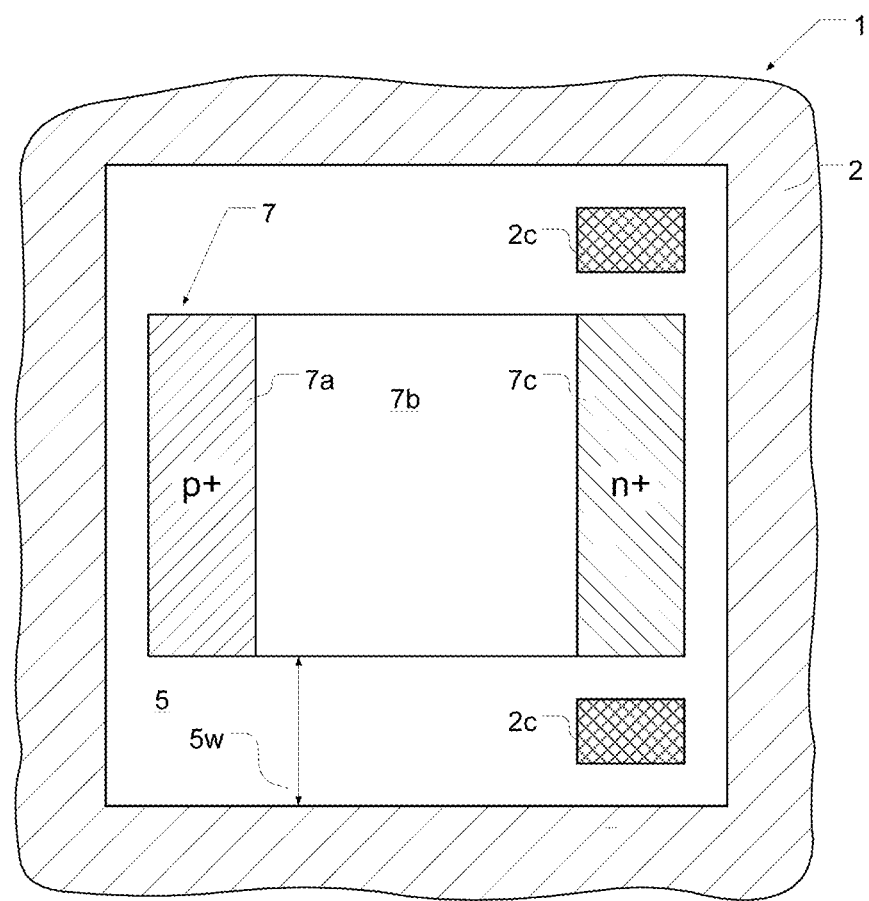
FIG. 5 is a plan view of a semiconductor p-n junction with conducting islands according to an embodiment of the present invention.

FIG. 5 shows an embodiment of the present invention. A p-n junction 7 consists of a heavily p-doped region 7a and a heavily n-doped region 7c, which regions are separated by a drift region 7b. The p-n junction is embedded in a dielectric termination region 5, which insulates the junction from a semiconductor region 2 formed around the dielectric termination region 5 in the horizontal plane. The p- and n-doped portions have an oblong shape in the horizontal plane. Two long sides of the doped portions 7a and 7c are facing each other. The two long sides of the doped portions 7a and 7c are parallel such that when a voltage difference is applied between the doped portions, the field between the doped portions is substantially homogeneous. Two islands 2c of an at least partially conducting material are positioned in the dielectric termination region 5 separated from the semiconductor material 2 and the doped portions 7a and 7b by the dielectric termination region. The two islands are juxtaposed with respect to the short sides of the n-doped portion 7c. The sides of the two islands facing the n-doped portion 7c have the same length as the short side of the n-doped portion, but this is not essential. The other two sides of the two islands (generally facing the p-doped portion) lie in the plane defined by the long side of the n-doped portion. The interface between the dielectric termination region 5 and the semiconductor region 2 is substantially parallel to the nearest side of the p-n junction in order to substantially avoid inhomogeneities in the electric field.

Figure 6:
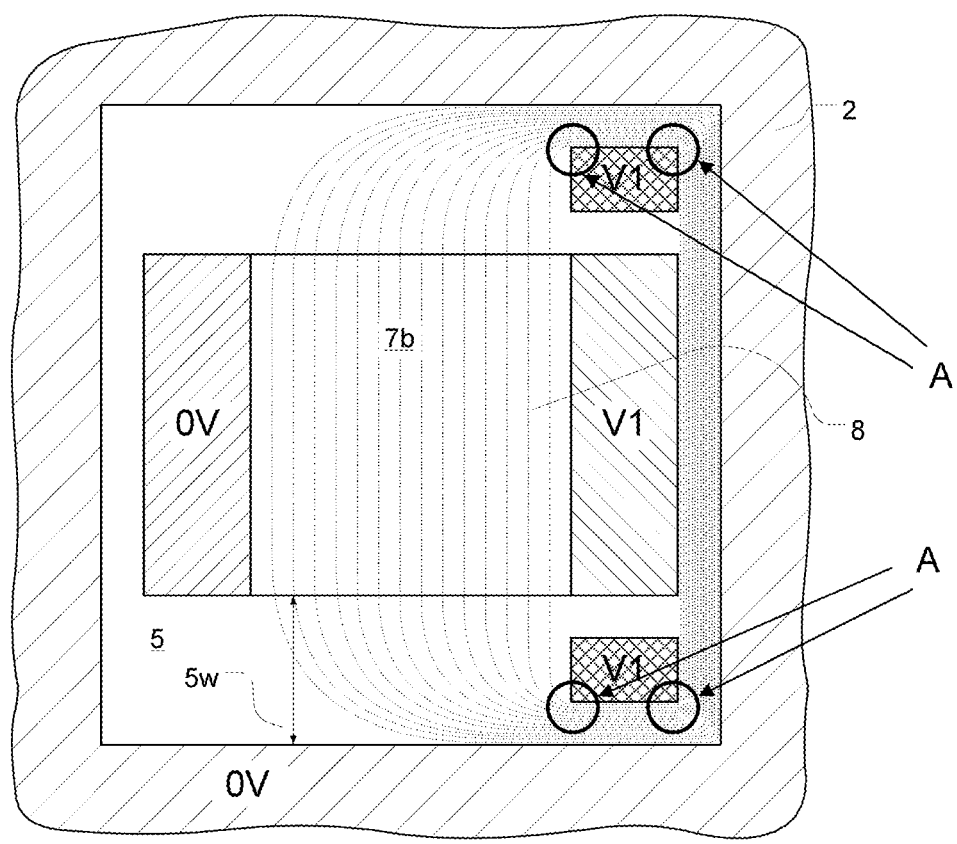
FIG. 6 is a plan view of the semiconductor p-n junction of FIG. 5 showing electrical potential lines.

FIG. 6 shows the configuration of FIG. 5 with electrical potential lines. The islands 2c have a connection (not shown) for being biased to the same voltage V1 as the n-doped region 7c. The surrounding semiconductor region 2 has a connection for being biased to a low voltage, such as 0V. In the example shown in FIG. 6, the semiconductor region 2 is biased to the same voltage of 0V as the p-doped portion. As there is no voltage drop across the n-doped portion 7c and the conducting island 2c, the potential lines exit the drift region uniformly on the interface between the drift portion 7b and the dielectric termination portion 5. Since the sides of the islands generally facing the p-doped portion lie in the plane defined by the side of the n-doped portion facing the p-doped portion the electrical potential lines exit the interface between the drift region 7b and the dielectric termination region 5 homogeneously. As a result, the regions with a high concentration of electrical field lines have moved away from the interface between the n-doped portion 7c, the dielectric termination portion 5 and the drift region 7b to the interface between the islands and the dielectric termination region. The areas indicated by 'A' in FIG. 6 are the regions with large electric field densities. The islands 2c are not directly involved in the device's operation, i.e. substantially no current is flowing through the islands, and therefore there is substantially no degradation effect due to carrier injection.

Figure 1:
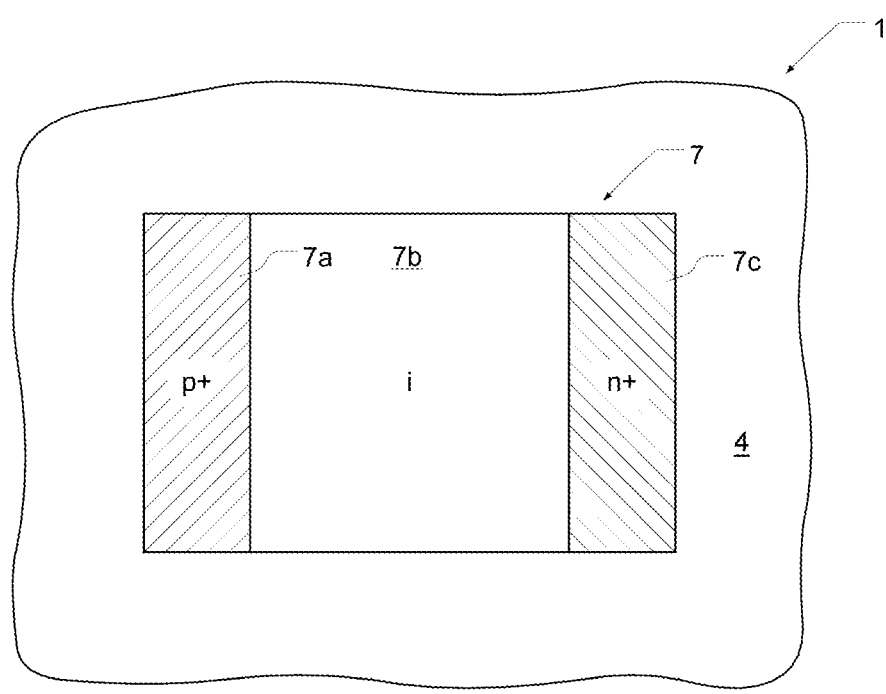
FIG. 1 is a plan view of a semiconductor p-n junction suspended in vacuum.
Figure 2:
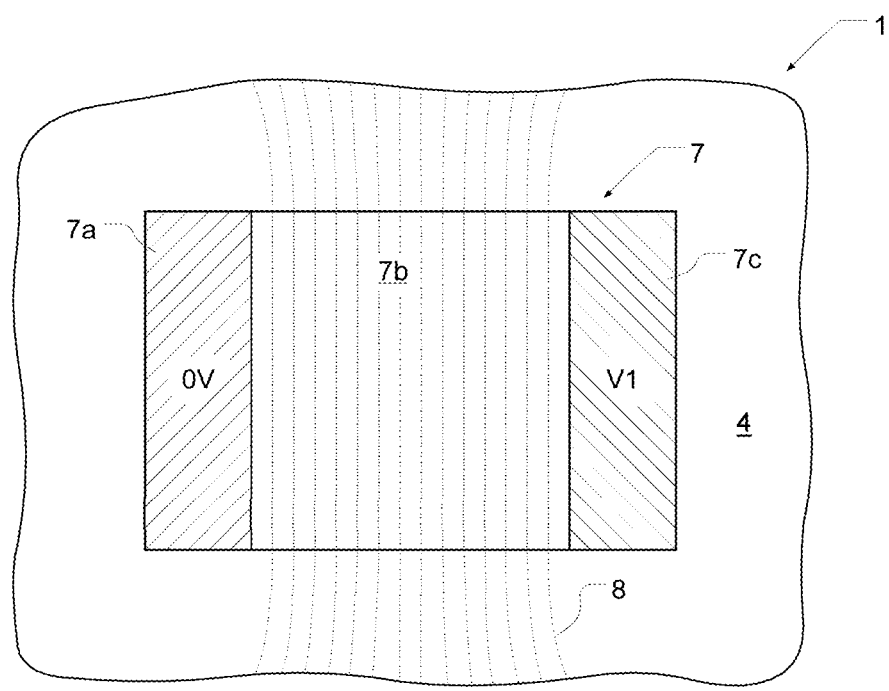
FIG. 2 is a plan view of the semiconductor device of FIG. 1 showing electrical potential lines.
Figure 3:
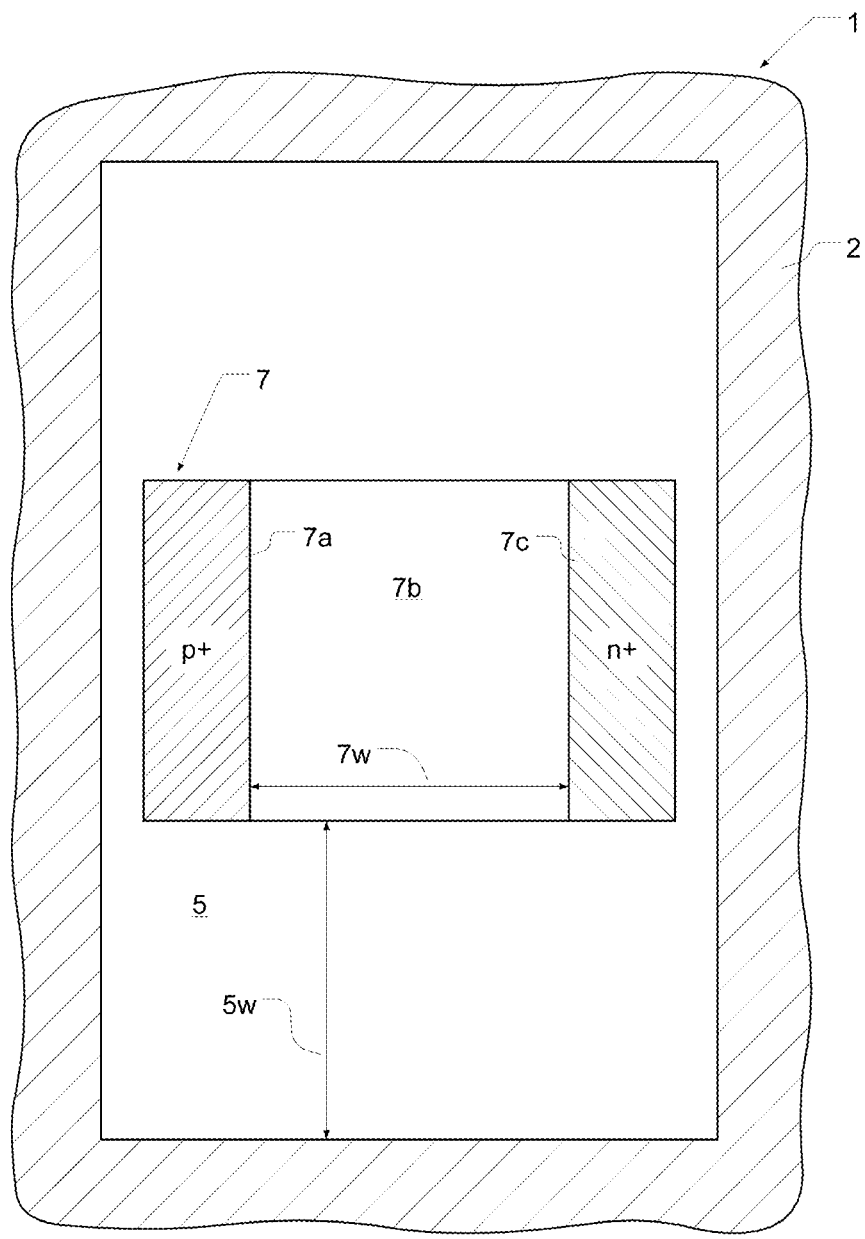
FIG. 3 is a plan view of a semiconductor p-n junction surrounded by an insulating region and semiconductor material.
Figure 4:
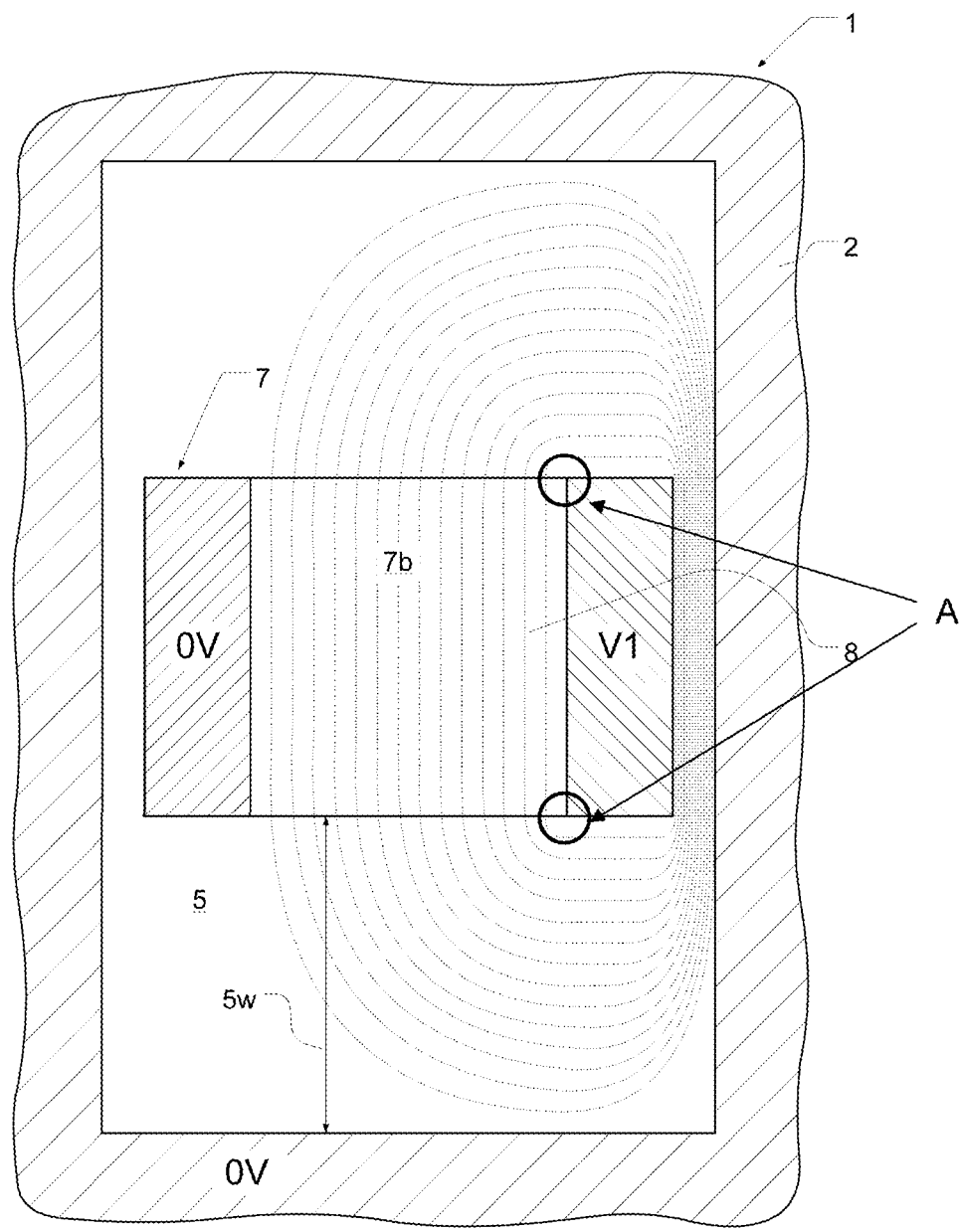
FIG. 4 is a plan view of the semiconductor device of FIG. 3 in which electrical potential lines are shown.

The distance 5w between the semiconductor region 2 and the p-n junction 7 can now be made smaller than in the case where there are no islands, as is shown in FIG. 4. Without islands, a reduction of the distance 5w would significantly increase the density of electric field lines at the interface between the n-doped portion 7c, the dielectric termination portion 5 and the drift region 7b.

Figure 7:
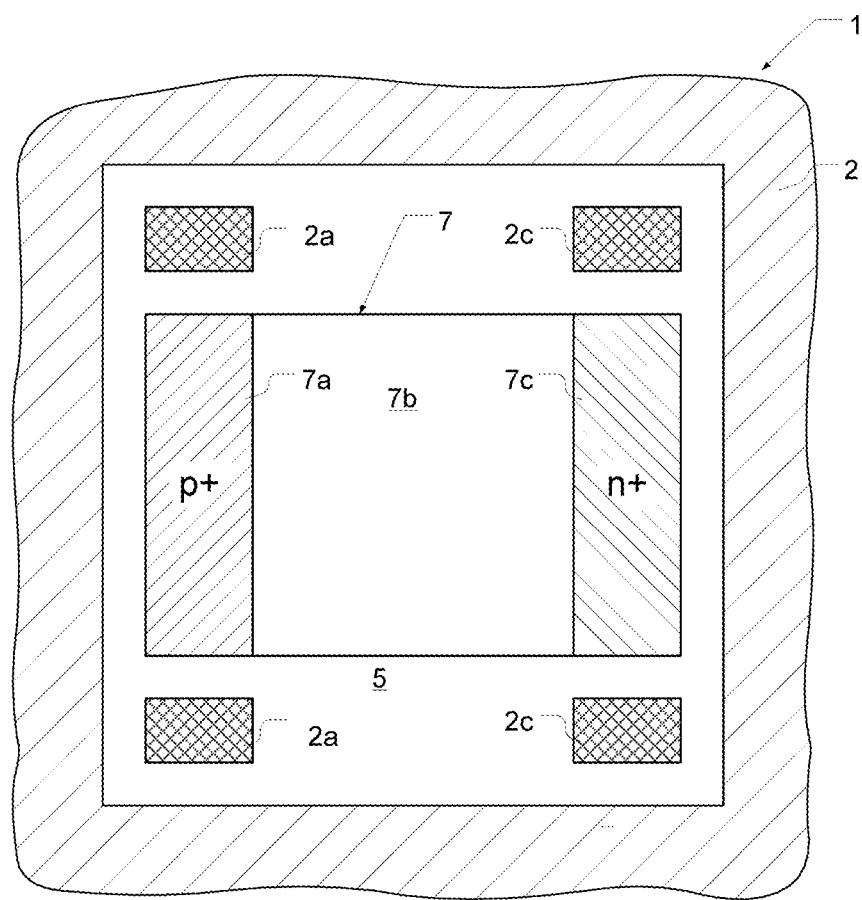
FIG. 7 is a plan view of a semiconductor p-n junction with further conducting islands according to an embodiment of the present invention.

More islands can be formed and connected for being biased in order to be able to manipulate the shape of the electric field. FIG. 7 shows an embodiment in which additional islands 2a are formed near to p-doped region 7a inside the dielectric termination region 5. The positioning of the additional islands 2a with respect to p-doped region 7a is substantially the same as the positioning of the islands 2c discussed above with respect to n-doped region 7c. The general positioning and shape of the islands is in one case symmetrical around the axes of symmetry of the p-n junction, because asymmetrical arrangements could result in electrical field lines being asymmetrical as well or would even result in further electric field peaks.

The material of the islands 2a, 2c can be the same as that of the doped regions 7a or 7c, or it can be a metal which is connected to be biased to the same voltage as the corresponding doped regions 7a or 7c. The islands should be at least partially conductive.

Figure 8:
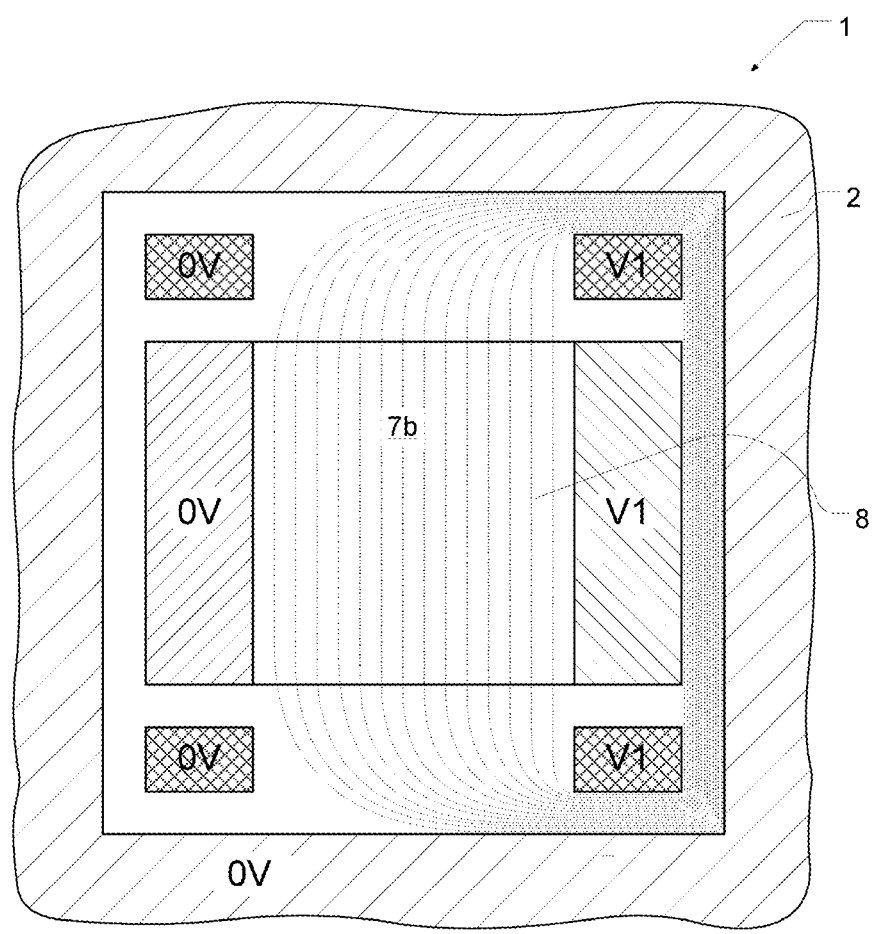
FIG. 8 is a plan view of the semiconductor p-n junction of FIG. 7 showing electrical potential lines.
Figure 9:
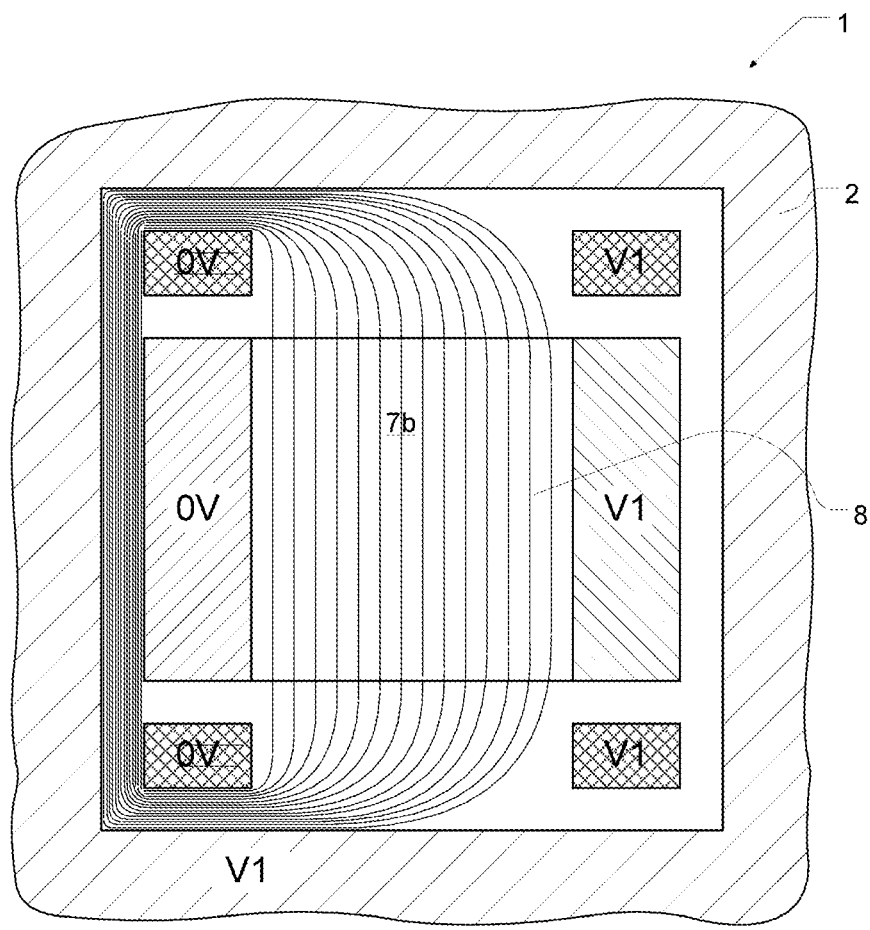
FIG. 9 is a plan view of the semiconductor p-n junction of FIG. 7 showing electrical potential lines.

FIGS. 8 and 9 show the device of FIG. 7 including potential lines. The islands and the dielectric region 2 are connected to be biased to a desired voltage. FIG. 8 shows the p-doped region 7a, the adjacent islands 2a and the dielectric region 2 all being biased to the same voltage of 0V. The n-doped region 7c and the adjacent islands 2c are biased to a second voltage V1. The potential lines wrap around the n-doped region 7c and islands 2c.

In FIG. 9 the n-doped region 7c, the adjacent islands 2c and the semiconductor region 2 are all biased to the same voltage of V1. The p-doped region 7a and the adjacent islands 2a are biased to a second voltage of 0V. The potential lines wrap around the p-doped region 7a and islands 2a.

Figure 10:
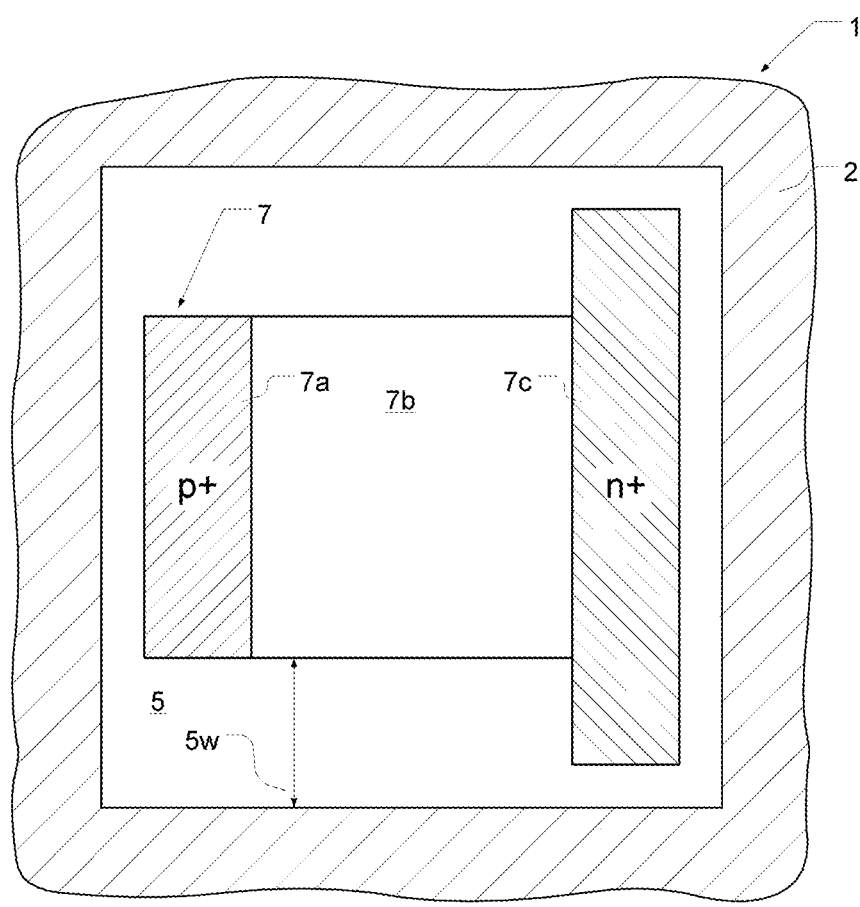
FIG. 10 is a plan view of a semiconductor p-n junction with an extended n-doped portion according to an embodiment of the present invention.
Figure 11:
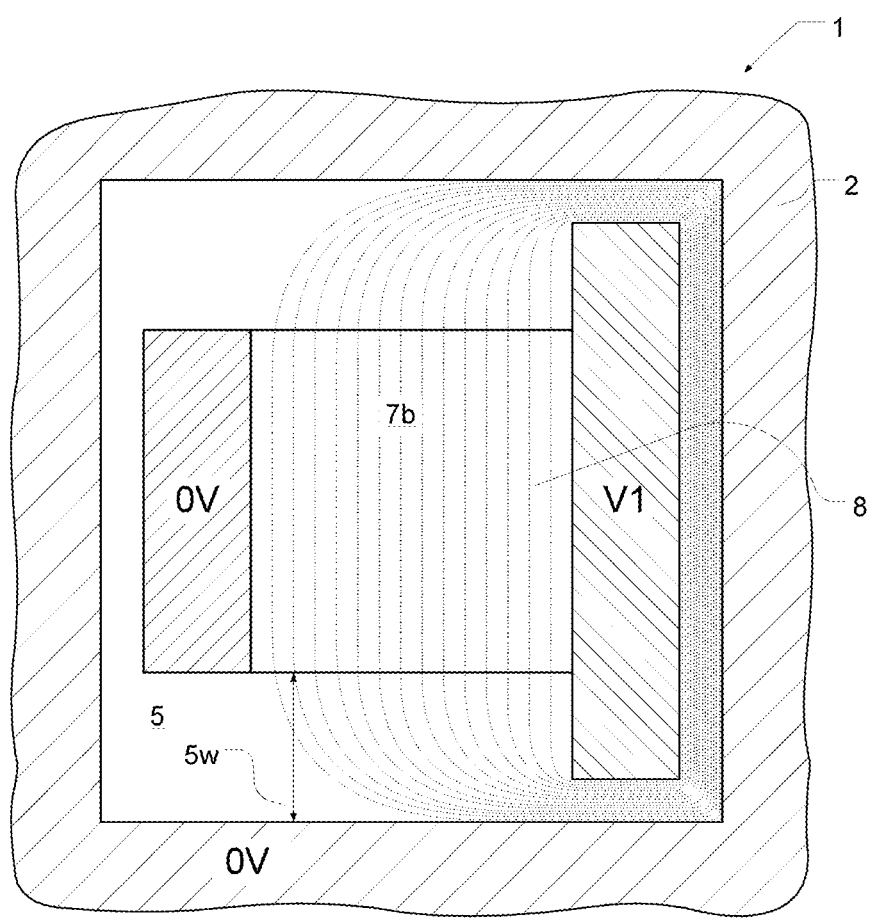
FIG. 11 is a plan view of the semiconductor p-n junction of FIG. 10 showing electrical potential lines.
Figure 12:
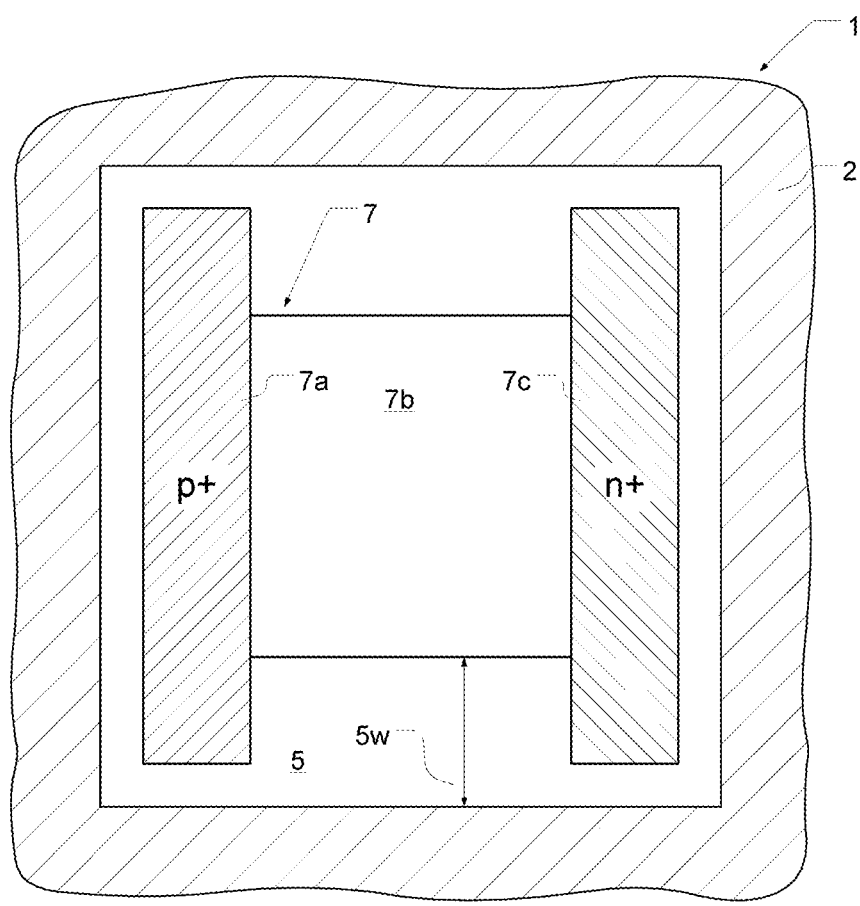
FIG. 12 is a plan view of a semiconductor p-n junction with extended doped portions according to an embodiment of the present invention.

Further embodiments are shown in FIGS. 10 to 12. Instead of islands being formed which are separate and insulated from the doped portions 7a, 7c, one or both of the doped portions are extended into the dielectric termination region in the direction of the short sides of the doped portions.

In FIG. 10, n-doped region 7c is extended laterally. While now the extended region 7c is part of the active device 7, the impact of dielectric degradation to the HV device's characteristics is small. The highly doped region 7c does not significantly deplete outside the region contacting the drift region 7b. The part of the highly doped region 7c which does not deplete (i.e. the portion of region 7c which extends beyond drift region 7b) does not carry out the HV blocking function. Therefore, no (significant) carrier injection occurs at the outer corners of the extension portions despite the electric field being strong.

FIG. 11 shows the device of FIG. 10 in which a voltage 0V is applied to the semiconductor region 2 and the p-doped portion 7a while a voltage V1 is applied to the n-doped portion 7c. The electrical potential lines 8 wrap around portion 7c and the regions with a high density of the electric field have moved away from the interface between the drift region 7b and the dielectric termination region 5. There are also no regions with high electric field density around the p-doped portion when the device is biased in this way. One could also extend the p-doped portion 7a instead of the n-doped portion 7c, to suit an arrangement in which the semiconductor portion 2 is biased to the same voltage as the n-doped portion so that there are no regions with high electric field density at the interface between doped region 7a, the drift region 7b and the dielectric termination region 5.

One may also extend both the p-doped region 7a and the n-doped region 7c into the termination region 5 as described above, so that, independent from the bias of surrounding dielectric portion 2, there are substantially no regions with high electric field density at any interface between doped region 7a or 7c, the drift region 7b and the dielectric termination region 5. Such a structure is shown in FIG. 12. The electrical potential lines distribution will be similar to that shown in FIG. 8 or 9.

In some embodiments, the islands 2a, 2c measure between 0.2 µm by 0.2 µm and 10 µm by 10 µm and the distance between the islands and the doped portions is between 0.2 µm and 10 µm. In some embodiments, the length of the extension of regions 7a and/or 7c is between 0.2 µm and 10 µm. In the above embodiments, the distance 5w (between the drift portion 7b and the surrounding semiconductor portion 2) is between 1 µm and 20 µm.

Sections 7a and 7c in the above embodiments are heavily doped p+ and n+ regions, which is typical for a diode. However, these regions may also be p and n doped regions, as may be typical in case of a HV MOSFET, for example.

The drift region 7b can be made of a single basis material (e.g. silicon), but the doping may either be uniform (e.g. a PIN diode) or non-uniform. For example, it can have a graded doping or it can consist of one pair or several layers of n- and p-type material (e.g. super junctions).

Although the invention has been described in terms of certain embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

What is claimed is:

1. A semiconductor device comprising:
   a p or p+ doped portion;
   an n or n+ doped portion separated from the p or p+ doped portion by a semiconductor drift portion;
   an insulating portion provided adjacent the drift portion and at least one of the doped portions in a region where the drift portion and said at least one doped portion meet; and
   at least one additional portion, wherein said at least one additional portion is located such that, when one of said doped portions and said at least one additional portion are biased at substantially the same electrical potential, electrical potential lines leave said semiconductor drift portion homogeneously, and when said one of said doped portions is biased at a first non-zero potential and said at least one additional portion is biased at a second non-zero potential, the second potential being different from the first potential, electrical potential lines leave the semiconductor drift portion inhomogeneously.

2. A device according to claim 1, wherein said at least one additional portion has a side which lies in a plane defined by a side of one of the doped portions wherein said side of the one of the doped portions faces the other one of the doped portions.

3. A device according to claim 1, wherein said at least one additional portion is arranged for reducing the variation of the electric field strength in said region when a voltage difference is applied between the doped portions.

4. A device according to claim 1 wherein said at least one additional portion is located such that, when said doped portions and said at least one additional portion are biased, the electrical potential lines leave said semiconductor drift portion homogeneously in said region where the drift portion and said at least doped portion meet.

5. A device according to claim 1 wherein the electrical potential lines are parallel in a region immediately adjacent said semiconductor drift portion.

* * * * *